United States Patent
Akiyoshi

(10) Patent No.: US 7,449,215 B2
(45) Date of Patent: Nov. 11, 2008

(54) METHOD OF MANUFACTURING DISPLAY DEVICE

(75) Inventor: Muneharu Akiyoshi, Saitama (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 616 days.

(21) Appl. No.: 11/071,155

(22) Filed: Mar. 4, 2005

(65) Prior Publication Data
US 2005/0196528 A1 Sep. 8, 2005

(30) Foreign Application Priority Data
Mar. 5, 2004 (JP) ............................. 2004-062655

(51) Int. Cl.
*B05D 5/06* (2006.01)
(52) U.S. Cl. .................... 427/162; 427/163.1; 427/164
(58) Field of Classification Search ................ 427/162, 427/163.1, 164
See application file for complete search history.

(56) References Cited

U.S. PATENT DOCUMENTS

| 5,225,039 A * | 7/1993 | Ohguri ......................... 216/24 |
| 6,696,105 B2 * | 2/2004 | Hiroki et al. ................. 427/466 |
| 6,819,426 B2 * | 11/2004 | Sezginer et al. ............. 356/401 |
| 2001/0036546 A1 * | 11/2001 | Kaytor et al. ............. 428/316.6 |
| 2002/0135876 A1 * | 9/2002 | Holm et al. ................. 359/566 |
| 2005/0195398 A1 * | 9/2005 | Adel et al. .................. 356/401 |

FOREIGN PATENT DOCUMENTS

JP 2003-163075 6/2003

OTHER PUBLICATIONS

Machine translation of JP 2003-163075; JPO; 2008.*
Koji Asakawa, et al., "Nanopatterning with Microdomains of Block Copolymers using Reactive-Ion Etching Selectivity" Jpn. J. Appl. Phys., vol. 41, part 1, No. 10, Oct. 2002, pp. 6112-6118.

* cited by examiner

*Primary Examiner*—Alain L Bashore
(74) *Attorney, Agent, or Firm*—Oblon, Spivak, McClelland, Maier & Neustadt, P.C.

(57) ABSTRACT

A method of manufacturing a display device includes a step of forming an insulating layer on a substrate, a step of coating a first mask material on an area associated with a first color pixel on the insulating layer, a step of coating a second mask material on an area associated with a second color pixel on the insulating layer, and a step of patterning the insulating layer using the first mask material and the second mask material, and forming a first diffraction grating and a second diffraction grating that have different grating pitches. The first mask material and the second mask material are coated by a selective coating method.

8 Claims, 4 Drawing Sheets

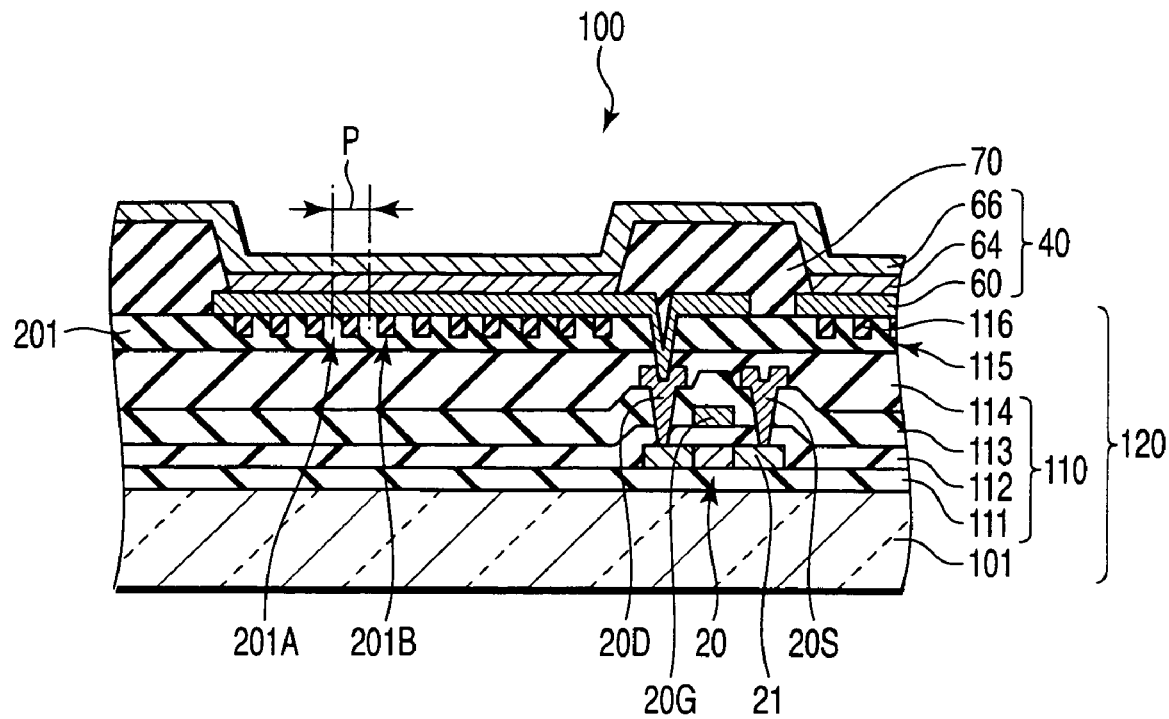
F I G. 2
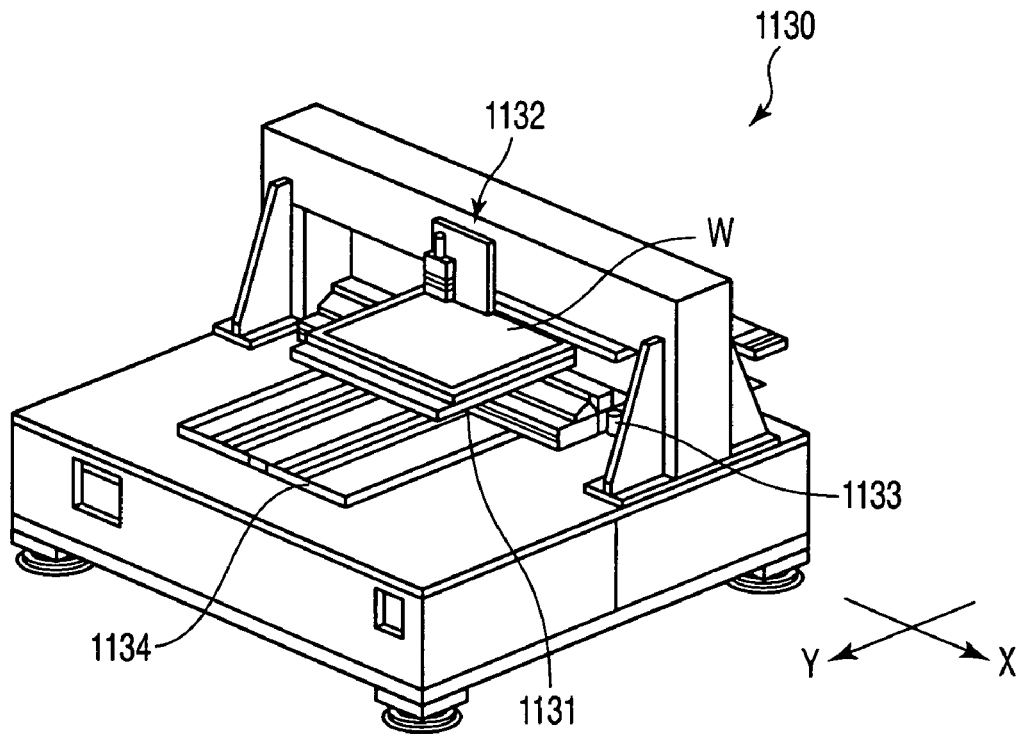
F I G. 3

METHOD OF MANUFACTURING DISPLAY DEVICE

CROSS-REFERENCE TO RELATED APPLICATIONS

This application is based upon and claims the benefit of priority from prior Japanese Patent Application No. 2004-062655, filed Mar. 5, 2004, the entire contents of which are incorporated herein by reference.

BACKGROUND OF THE INVENTION

1. Field of the Invention

The present invention relates generally to a method of manufacturing a display device, and more particularly to a method of manufacturing a display device comprising a plurality of self-luminous elements.

2. Description of the Related Art

In recent years, organic electroluminescence (EL) display devices have attracted attention as flat-panel display devices. Since the organic EL display device is a self-luminous device, it has such features as a wide viewing angle, small thickness without a need for backlight, low power consumption, and a high responsivity speed.

For these features, the organic EL display device is a promising candidate for the next-generation plat-panel display device, which will take the place of liquid crystal display devices. The organic EL display device includes an array substrate. The array substrate is configured such that a plurality of organic EL elements are arranged in a matrix. Each organic EL element has such a structure that an organic active layer containing an organic compound with a light-emitting function is sandwiched between an anode and a cathode.

In a typical method for realizing an organic EL display device that is capable of color display, color pixels that emit red (R), green (G) and blue (B) light are arranged. However, there is such a problem that only about 20% of light, which is generated within the organic EL element, can be taken out to outside. If a sufficient luminance is to be obtained, it is necessary, although undesirable, to supply a large current to the organic EL element.

In order to improve the light extraction efficiency of taking out light that is generated within the organic EL element, there has been proposed a technique in which a diffraction grating is disposed (see, e.g. Jpn. Pat. Appln. KOKAI Publication No. 2003-163075).

BRIEF SUMMARY OF THE INVENTION

The present invention has been made in consideration of the above-described problem, and the object of the invention is to provide a method of manufacturing a display device with an enhanced display performance and a high manufacturing yield.

According to a first aspect of the present invention, there is provided a method of manufacturing a display device comprising a first color pixel and a second color pixel that are disposed on a substrate and emit light of different wavelengths; a first diffraction grating that is provided in association with the first color pixel; and a second diffraction grating that is provided in association with the second color pixel and has a grating pitch that is different from a grating pitch of the first diffraction grating, the method comprising: a step of forming an insulating layer on the substrate; a step of coating a first mask material on an area associated with the first color pixel on the insulating layer; a step of coating a second mask material on an area associated with the second color pixel on the insulating layer; and a step of patterning the insulating layer using the first mask material and the second mask material, and forming the first diffraction grating and the second diffraction grating, respectively, wherein the first mask material and the second mask material are coated by a selective coating method.

According to a second aspect of the present invention, there is provided a method of manufacturing a display device comprising a first color pixel and a second color pixel that are disposed on a substrate and emit light of different wavelengths; a first diffraction grating that is provided in association with the first color pixel; and a second diffraction grating that is provided in association with the second color pixel and has a grating pitch that is different from a grating pitch of the first diffraction grating, the method comprising: a step of forming an insulating layer on the substrate; a step of selectively coating a first polymer on an area associated with the first color pixel on the insulating layer; a step of selectively coating a second polymer on an area associated with the second color pixel on the insulating layer; and a step of phase-separating the first polymer and the second polymer, thereby forming the first diffraction grating and the second diffraction grating, respectively.

The present invention can provide a method of manufacturing a display device with an enhanced display performance and a high manufacturing yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a partial cross-sectional view that schematically shows the structure of a 1-pixel region of the organic EL display device shown in FIG. 1;

FIG. 3 schematically shows the structure of an ink jet apparatus for coating a mask material;

DETAILED DESCRIPTION OF THE INVENTION

A method of manufacturing a display device according to an embodiment of the present invention will now be described with reference to the accompanying drawings. In this embodiment, a self-luminous display device, such as an organic EL (electroluminescence) display device, is described, by way of example, as the display device.

Figure 1:
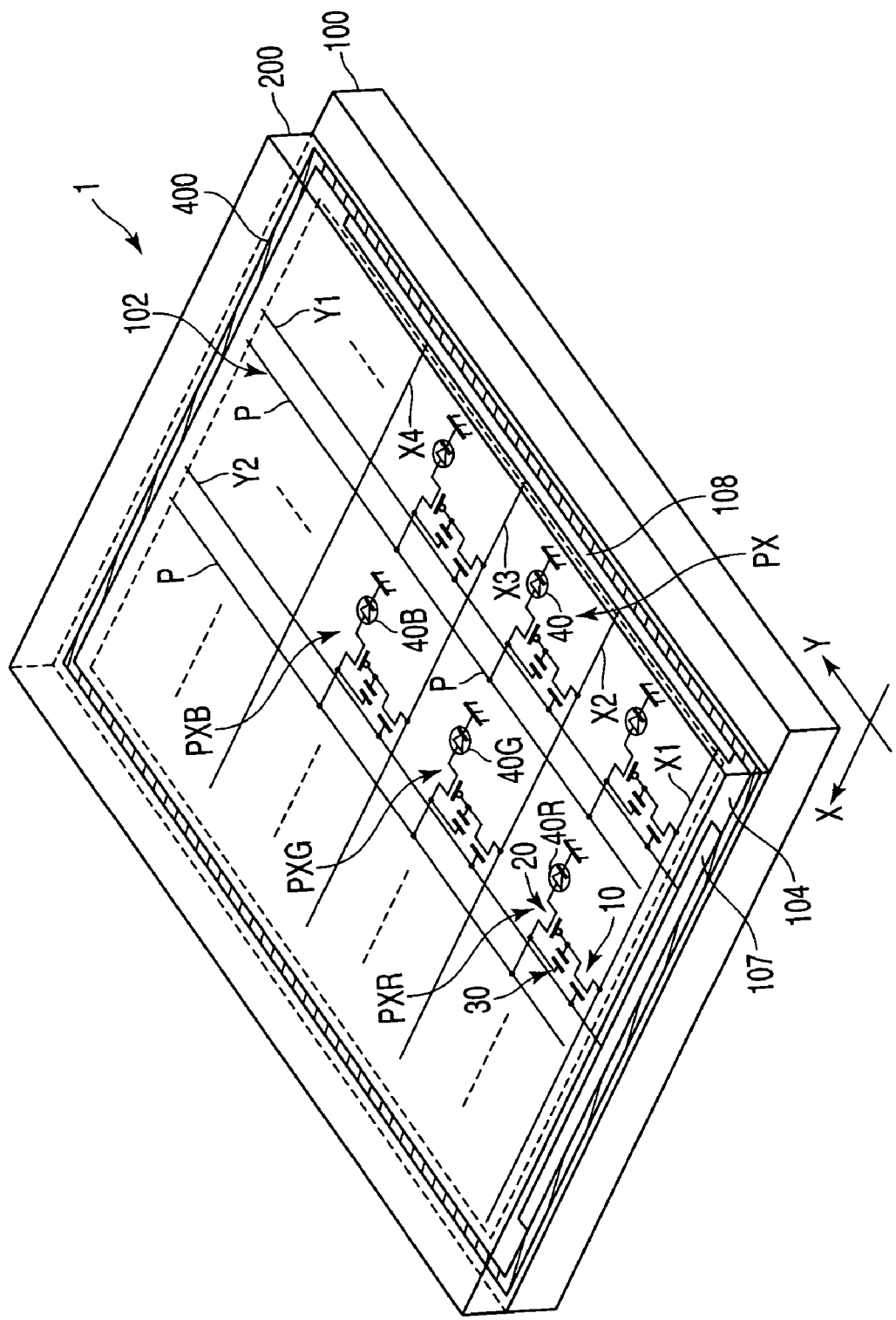
FIG. 1 schematically shows the structure of an organic EL display device according to an embodiment of the present invention.

As is shown in FIG. 1, the organic EL display device includes an array substrate 100 having a display area 102 for displaying an image, and a sealing member 200 that seals at least the display area 102 of the array substrate 100. The display area 102 comprises a plurality of pixels PX (R, G, B) that are arranged in a matrix.

Each of the pixels PX (R, G, B) includes a pixel switch 10 with a function of electrically separating an on-state pixel and an off-state pixel and retaining a video signal to the on-state pixel; a driving transistor 20 that supplies a desired driving current to an associated display element on the basis of the video signal that is supplied via the pixel switch 10; and a storage capacitance element 30 that stores a gate-source potential of the driving transistor 20 for a predetermined time period. Each of the pixel switch 10 and driving transistor 20 is composed of, e.g. a thin-film transistor, and includes a semi-conductor layer, which is formed of polysilicon, in this embodiment.

Each of the pixels PX (R, G, B) includes an organic EL element 40 (R, G, B) functioning as a display element. Specifically, the red pixel PXR includes an organic EL element 40R that emits light corresponding to a wavelength of red. The green pixel PXG includes an organic EL element 40G that emits light corresponding to a wavelength of green. The blue pixel PXB includes an organic EL element 40B that emits light corresponding to a wavelength of blue.

The respective organic EL elements 40 (R, G, B) have basically the same structure. For example, as shown in FIG. 2, the organic EL element 40 comprises a first electrode 60 that is formed in an insular shape in each pixel PX; a second electrode 66 that is formed commonly to all the pixels PX so as to opposed to the first electrodes 60; and an organic active layer 64 that functions as an optical active layer interposed between the first electrodes 60 and the second electrode 66.

The array substrate 100 includes a plurality of scan lines Ym (m=1, 2, ... ) that are arranged in a row direction (i.e. Y-direction in FIG. 1) of pixels PX, a plurality of signal lines Xn (n=1, 2, ... ) that are arranged in a direction (i.e. X-direction in FIG. 1) that crosses the scan lines Ym substantially at right angles, and power supply lines P for supplying power to the first electrodes 60 of the organic EL elements 40. The array substrate 100 further includes a scan line drive circuit 107, which supplies scan signals to the scan lines Ym, and a signal line drive circuit 108, which supplies video signals to the signal lines Xn, in a peripheral area 104 that is provided around the outer periphery of the display area 102.

All scan lines Ym are connected to the scan line drive circuit 107. All signal lines Xn are connected to the signal line drive circuit 108. The pixel switches 10 are disposed near intersections between the scan lines Ym and signal lines Xn. The pixel switch 10 has a gate electrode connected to the scan line Ym, a source electrode connected to the signal line Xn, and a drain electrode connected to one end of the storage capacitance element 30 and to a gate electrode 20G of the driving transistor 20.

The driving transistor 20 is connected in series to the organic EL element 40. The driving transistor 20 has a source electrode 20S connected to the other end of the storage capacitance element 30 and to the power supply line P, and a drain electrode 20D connected to the first electrode 60 of the organic EL element 40.

The power supply lines P are connected to a first electrode power supply line (not shown) that is disposed on the periphery of the display area 102. The second electrode 66 of the organic EL element 40 is connected to a second electrode power supply line (not shown) that is disposed on the periphery of the display area 102 and supplies a common potential (a ground potential in this example).

The array substrate 100, as shown in FIG. 2, includes the organic EL element 40 that is disposed on a wiring substrate 120. The wiring substrate 120 is configured such that the pixel switch 10, driving transistor 20, storage capacitance element 30, scan line drive circuit 107, signal line drive circuit 108, various lines (e.g. scan lines, signal lines and power supply lines) and a diffraction grating (to be described later) are provided on an insulating support substrate 101 such as a glass substrate or a plastic sheet.

The first electrode 60 that is a structural component of the organic EL element 40 is disposed on the wiring substrate 120. The first electrode 60 functions as an anode and is formed of a light-transmissive electrically conductive material such as ITO (indium tin oxide) or IZO (indium zinc oxide) in this example.

The organic active layer 64 includes at least a light-emitting layer and is formed of an organic material. The organic active layer 64 may include a layer other than the light-emitting layer. For example, the organic active layer 64 may be constructed of a multi-layer structure that includes a hole buffer layer and an electron buffer layer, which are formed commonly to all color pixels, and an organic light-emitting layer, which is formed for each of the color pixels. Alternatively, the organic active layer 64 may be constructed of two layers or a single layer in which functions of various layers including a light-emitting layer are integrated. The hole buffer layer includes a hole injection layer and a hole transport layer and is interposed between the anode and the organic light-emitting layer. The hole buffer layer is formed of a thin film of, e.g. an aromatic amine derivative, a polythiophene derivative or a polyaniline derivative. The light-emitting layer is formed of an organic compound with a function of emitting red, green or blue light. When a high-polymer light emitting material is used, the light-emitting layer is formed of PPV (polyparaphenylenevinylene), or a polyfluorene derivative or a precursor thereof. In the organic active layer 64, it is necessary that only the light-emitting layer be formed of an organic material. The layers other than the light-emitting layer may be formed of either an inorganic material or an organic material.

The electron buffer layer includes an electron injection layer and an electron transport layer. The electron buffer layer is interposed between the cathode and the organic light-emitting layer and is formed of, e.g. a thin film of, e.g. LiF (lithium fluoride) or Alq$_3$.

The second electrode 66 is disposed on the organic active layer 64 commonly to all the organic EL elements 40. The second electrode 66 is formed of a metallic film with an electron injection function such as Ca (calcium), Al (aluminum), Ba (barium), Ag (silver) or Yb (ytterbium), and functions as a cathode. The second electrode 66 may be a two-layer structure in which the surface of a metal film functioning as a cathode is coated with a cover metal. The cover metal is formed of, e.g. aluminum.

The array substrate 100 includes partition walls 70 that separate the pixels RX (R, G, B). The partition walls 70 are arranged in a lattice shape or in stripes along the peripheral edges of the first electrodes 60.

In the meantime, since the organic EL element 40 is a self-luminous element, light is emitted from the organic EL element 40 in all directions. In order to efficiently extract EL light for the display device that is designed to be viewed in a specified direction, it is imperative to use a technique for extracting EL light, which is emitted in directions other than the viewing direction, as EL light that is emitted in the viewing direction, by making use of reflection or refraction.

As this technique, there is known a method wherein a member having projections and recess with a certain degree of regularity, that is, a diffraction grating, is disposed between the organic active layer 64 and a point of observation, and EL light, which is emitted indirections other than the viewing direction, is refracted toward the viewing direction with some frequency for effective use. Although such a diffraction grating can easily be fabricated for a small substrate, it is difficult to form a diffraction grating with high accuracy for a large substrate. In addition, in the organic EL display device that is capable of color display, angles of diffraction are different between wavelengths corresponding to red (R), green (G) and blue (B). It is thus necessary to set optimal grating pitches of the diffraction grating for the respective wavelengths.

In the present embodiment, a diffraction grating, which has optimal grating pitches for wavelengths of EL light emitted from the organic EL elements 40 (R, G, B), is provided in association with the three kinds of color pixels PX (R, G, B) that emit red, green and blue light. Thereby, the display performance is remarkably improved.

Specifically, as shown in FIG. 2, the wiring substrate 120 includes a first insulating layer 110 that is disposed on the support substrate 101, and a diffraction grating 115 that is disposed between the first insulating layer 110 and the organic EL element 40. In this embodiment, the first insulating layer 110 includes an under-coat layer 111, a gate insulation film 112, an interlayer insulation film 113 and a planarization film 114. The under-coat layer 111 is formed of, e.g. a silicon nitride (SiN) film that is disposed on the support substrate 101. The gate insulation film 112 is formed of a silicon oxide ($SiO_2$) film that is disposed on the under-coat layer 111 and covers, e.g. a semiconductor layer 21 of the driving transistor 20. The interlayer insulation film 113 is formed of a silicon oxide ($SiO_2$) film that is disposed on the gate insulation film 112 and covers, e.g. the gate electrode 20G of the driving transistor 20. The planarization layer 114 is a hard resin coat (HRC) layer disposed on the interlayer insulation film 113.

The diffraction grating 115 can be formed by patterning a second insulating layer 201 that is disposed on the first insulating layer 110. As a matter of course, the second insulating layer 201 is formed of a light-transmissive material, such as silicon nitride, which passes EL light that is emitted from the organic EL element 40. The diffraction grating 115 has projections and recesses on the surface of the second insulating layer 201 (i.e. on the surface opposed to the organic EL element) with optimal grating pitches P for the respective pixels. In this embodiment, the grating pitch P corresponds to a distance between the centers of adjacent two projections 201A. The surface of the second insulating layer 201, that is, the projection-and-recess surface of the second insulating layer 201, is planarized by the planarization layer 116.

The planarization layer 116 is formed of a material that has a refractive index different from the refractive index of the second insulating layer 201 and has light transmissivity for passing EL light that is emitted from the organic EL element 40. Preferably, the planarization layer 116 should be an organic insulating film having a glass transition point at 90° C. to 120° C. In this embodiment, the planarization layer 116 is an HRC (hard resin coat) layer. For example, the second insulating layer 201 that is formed of the silicon nitride film has a refractive index of 2.2, whereas the HRC layer has a refractive index of 1.5.

It is preferable to set the grating pitch P of the diffraction grating 115 such that a color pixel that emits light with a greater wavelength has a greater grating pitch P. For example, the grating pitch of the diffraction grating, which is formed on the red pixel PXR, is 0.22 to 1.15 μm. The grating pitch of the diffraction grating, which is formed on the green pixel PXG, is 0.18 to 0.95 μm. The grating pitch of the diffraction grating, which is formed on the blue pixel PXB, is 0.16 to 0.85 μm.

The diffraction grating 115 having different grating pitches for the respective color pixels can be formed as follows. After the second insulating layer 201 is formed, a phase-separating polymer is coated on the second insulating layer 201 by a selective coating method, such as an ink jet method. By using the phase-separating polymer as a mask material, the diffraction gratings 115 can be formed at a time by one-time patterning.

Specifically, a phase-separating polymer is subjected to heat treatment, whereby parts with high etching resistance and parts with low etching resistance can be formed uniformly within the same layer on the order of nanometers. In addition, by changing the kind of polymer or mixture ratio, phase-separation intervals (pitch of parts with high etching resistance) can easily be varied. Phase-separating polymers with different pitches can be prepared selectively for the respective color pixels. It is possible to adopt, as phase-separating polymers, materials that are disclosed, for instance, in Jpn. J. Appl. Phys. Vol. 41 (2002), pp. 6112-6118, Part 1, No. 10, October 2002.

To be more specific, three kinds of polymers, which are phases-separated to have pitches in association with the respective wavelengths of red (R), green (G) and blue (B), are prepared. The polymers are coated by an ink jet method and subjected to heat treatment. Thus, phase-separated masks with predetermined pitches can be formed in accordance with the kinds of polymers. By executing patterning with use of the masks, projections and recesses can easily be formed anywhere with the pitches in association with the respective wavelengths.

A description is given of an ink-jet coating apparatus for coating a mask material of a polymer. For example, as shown in FIG. 3, a coating apparatus 1130 includes a stage 1131 on which a work W, or a substrate (wiring substrate 120), is placed. An ink jet head 1132 is disposed above the stage 1131. A rail 1133 that extends in an X-direction and a rail 1134 that extends in a Y-direction are disposed under the stage 1131 so as to cross each other substantially at right angles. The stage 1131 can be moved over the rail 1133 in the X-direction by means of a driving mechanism (not shown). In addition, the rail 1133, together with the stage 1131, can be moved over the rail 1134 in the Y-direction by means of a driving mechanism (not shown). With this structure, the work W that is placed on the stage 1131 can be moved relative to the ink jet head 1132 in the X-direction and Y-direction that cross each other substantially at right angles.

Next, a fabrication process of the diffraction grating 115 is described.

Figure 4A:
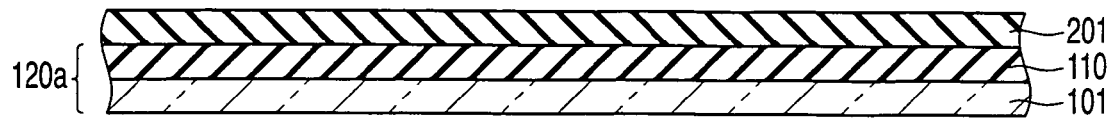
FIG. 4A illustrates a step of preparing a wiring substrate including a first insulating layer and a step of forming a second insulating layer on the first insulating layer in a process of fabricating an organic EL display device.

To begin with, as illustrated in FIG. 4A, a substrate 120a including a first insulating layer 110 is prepared. Specifically, processes for forming and patterning metal films and insulation films are repeated. Thereby, on the insulating substrate 101, the first insulating layer 110 is formed, which includes pixel switches 10, driving transistors 20, storage capacitance elements 30, scan line drive circuit 107, signal line drive circuit 108, and various lines such as signal lines Xn, scan lines Ym and power supply lines P, as well as an under-coat layer 111, a gate insulation film 112, an interlayer insulation film 113 and a planarization layer 114. Thus, the substrate 120a, which includes about 0.92 million pixels (480 pixels in the vertical direction and 640×3 (R, G, B) pixels in the horizontal direction), is prepared. A structure in which the diffraction grating 115 is formed on the substrate 120a is referred to as a wiring substrate 120.

A second insulating layer 201 is formed on a major surface of the substrate 120a, that is, on the surface of the first insulating layer 110. In this example, the second insulating layer 201 refers to a silicon nitride film, which is disposed on the planarization layer 114. The second insulating layer 201 and planarization layer 114 include a contact hole for establishing electrical connection to the drain electrode 20D of the driving transistor 20.

Figure 4B:
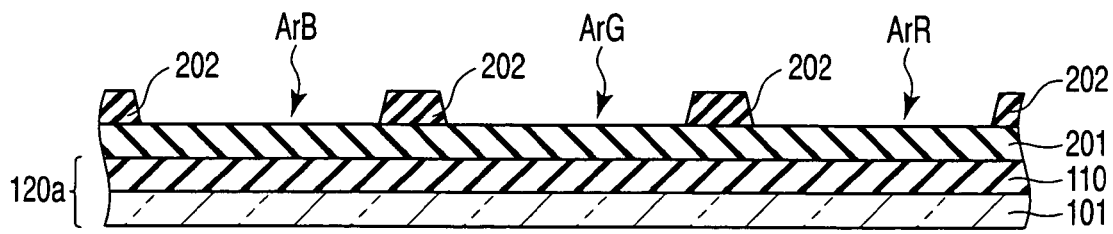
FIG. 4B illustrates a step of forming separation walls on the second insulating layer in the process of fabricating the organic EL display device.

Subsequently, as shown in FIG. 4B, a resist 202 for separating areas corresponding to the respective color pixels is formed on the second insulating layer 201. The resist 202 is, for instance, a positive-tone resist that is used for ordinary patterning. The resist 202 is provided on the entire surface of the second insulating layer 201 and is patterned to remove parts that correspond to areas where the diffraction grating 115 is to be formed, that is, a blue area ArB corresponding to the blue pixel, a green area ArG corresponding to the green pixel and a red area ArR corresponding to the red pixel. The area Ar (R, G, B), where the diffraction grating 115 is to be formed, is formed to have a slightly greater size than an opening portion of each color pixel that is to be formed later. In other words, the outer periphery of the area Ar (R, G, B) is disposed to include the outer periphery of the color pixel. The resist 202 serves as a separation wall for preventing mixing of mask materials, which are to be subsequently coated, between adjacent different color pixels. The resist 202 may be formed in a lattice shape on the second insulating layer 201, or may be formed in stripes between color pixels in a case where the pixels of the same color are arranged in the row direction or column direction.

Figure 4C:
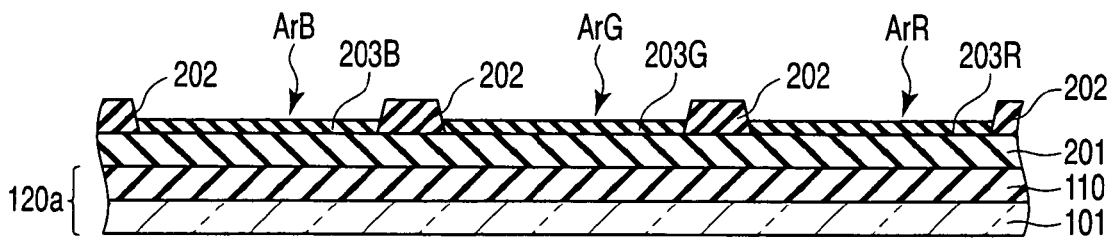
FIG. 4C illustrates a step of coating mask materials on the second insulating layer in the process of fabricating the organic EL display device.

Next, as shown in FIG. 4C, mask materials 203 for patterning the second insulating layer 201 are coated on the second insulating layer 201 by an ink jet method. Specifically, the substrate 120a, on which the resist 202 is provided, is placed on the stage 1131 of the coating apparatus 1130. A mask material 203B for the blue area is coated on the blue area ArB by means of the ink jet head 1132. Similarly, a mask material 203G for the green area is coated on the green area ArG, and a mask material 203R for the red area is coated on the red area ArR.

The mask materials 203 (R, G, B), as mentioned above, are phase-separating polymers. The phase-separating polymers are prepared so that these polymers, when phase-separated by heat treatment, may have different mask pitches, that is, different intervals between parts with high etching resistance. To be more specific, the mask material 203B is prepared to have a mask pitch of 0.16 to 0.85 μm when it is phase-separated. The mask material 203G is prepared to have a mask pitch of 0.18 to 0.95 μm when it is phase-separated. The mask material 203R is prepared to have a mask pitch of 0.22 to 1.15 μm when it is phase-separated.

Figure 4D:
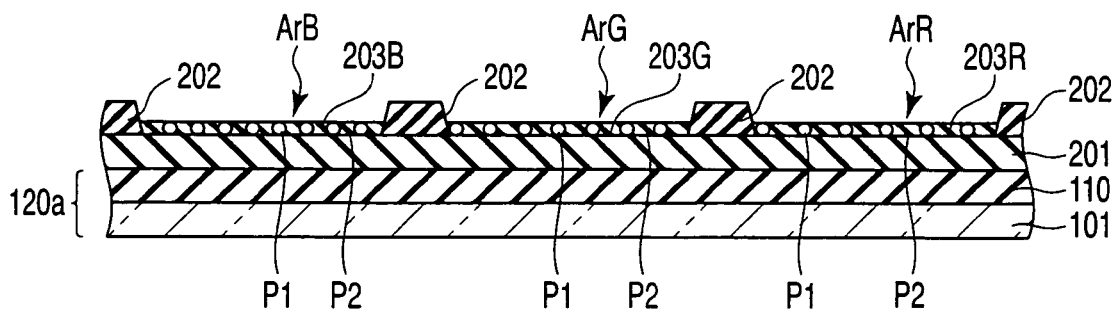
FIG. 4D illustrates a step of phase-separating the mask materials in the process of fabricating the organic EL display device.

Subsequently, the substrate 120a, on which the mask materials 203 (R, G, B) are coated, is subjected to heat treatment. Specifically, the substrate 120a, on which the mask materials 203 are coated, is annealed at 180° C. for eight hours. As a result, as shown in FIG. 4D, the mask materials 203 (R, G, B) are phase-separated with predetermined pitches. In other words, the mask materials 203 (R, G, B) are phase-separated into parts P1 with high etching resistance and parts P2 with low etching resistance. In this case, the anneal time may be set to a time that is needed for annealing the mask material that is least easily phase-separated.

Figure 4E:
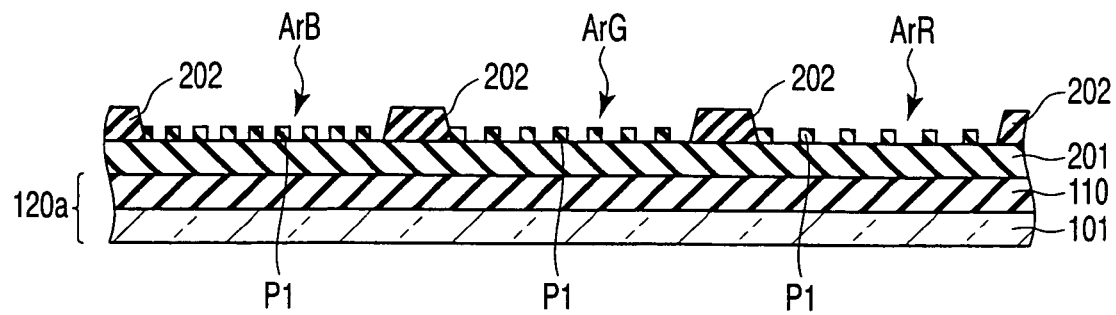
FIG. 4E illustrates a step of forming a diffraction grating in the process of fabricating the organic EL display device.

Then, a diffraction grating 115 is formed. As shown in FIG. 4E, the mask materials 203 (R, G, B) are etched. Specifically, the parts of the phase-separating polymers (parts P2 with low etching resistance) that are easily dry-etched are removed by $O_2$ ashing. Preferably, the etching selectivity ratio between the resist 202 and the easy-to-etch parts P2 of the mask materials (phase-separating polymers) 203 is set at (resist:mask material=about 1:about 1.7). Thereby, only the parts P1 with high etching resistance of the mask materials 203 are left on the second insulating film 201.

Figure 4F:
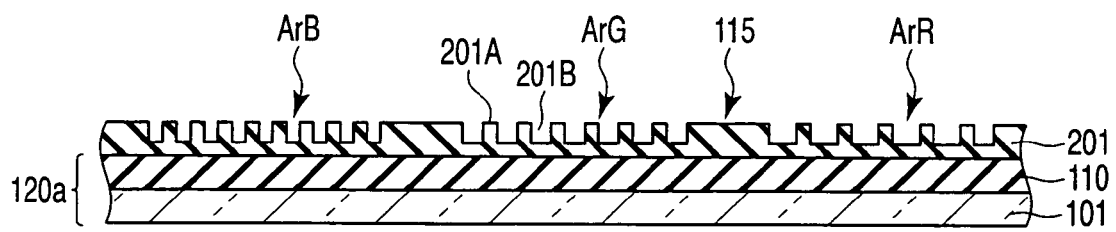
FIG. 4F illustrates a step of forming the diffraction grating in the process of fabricating the organic EL display device.

Thereafter, as shown in FIG. 4F, the second insulating layer 201 is etched. Specifically, the second insulating layer 201 is dry-etched via the mask materials 203 with a $CF_4$—$O_2$-based mixture gas. Thereby, projections 201A (or recesses 201B) with a height (or depth) of about 70 to 100 nm are formed in the second insulating layer 201. Then, the resist 202 and mask materials 203, which are left on the surface of the second insulating layer 201, are removed.

Figure 4G:
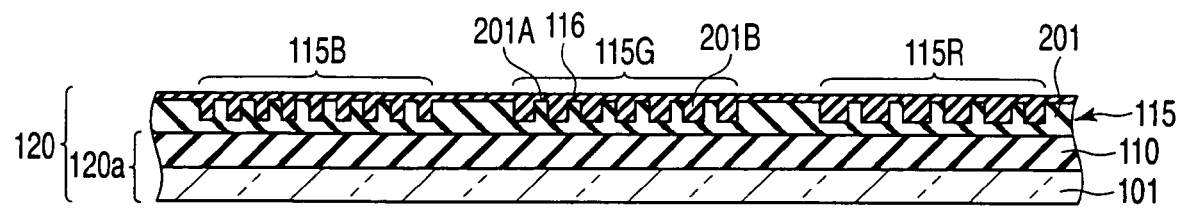
FIG. 4G illustrates a step of forming the diffraction grating in the process of fabricating the organic EL display device.

Subsequently, as shown in FIG. 4G, a planarization layer 116, which is formed of a material having a refractive index different from a refractive index of the second insulating layer 201, is formed so as to fill the recess portions 201B and to planarize the surface of the second insulating layer 201. Specifically, a photosensitive organic insulation film, which has a glass transition point of about 90° C. to 120° C., is formed on the second insulating layer 201 such that the planar part has a thickness of about 0.5 to 0.9 μm. Then, a contact hole for establishing electrical connection to the drain electrode 20D of the driving transistor 20 is formed, and heat treatment is executed at about 100° C. for 30 minutes. The organic insulation film is kept at a fixed temperature near the glass transition point in the heat treatment, whereby the fluidity of the organic insulation film is increased. Thus, the organic insulation film fills the recesses 201B in the surface of the second insulating layer 201 and is disposed on the projections 201A of the second insulating layer 201. Furthermore, the surface of the organic insulation film itself is planarized. In this way, the planarization layer 116 is formed. Through these steps, a diffraction grating 115 with different grating pitches is formed on the blue area ArB, green area ArG and red area ArR. Specifically, the diffraction grating 115 includes a diffraction grating 115B for the blue area, a diffraction grating 115G for the green area and a diffraction grating 115B for the blue area. The diffraction grating 115B is formed via the mask material 203B for the blue area so as to have a first grating pitch. The diffraction grating 115G is formed via the mask material 203G for the green area so as to have a second grating pitch that is different from the first grating pitch. The diffraction grating 115R is formed via the mask material 203R for the red area so as to have a third grating pitch that is different from the first and second grating pitches. In this case, the diffraction grating 115 is globally planarized with a thickness of about 30 nm from the upper ends of the projections 201A of the second insulating layer 201.

Subsequently, a first electrode 60 of ITO is formed at each pixel of the wiring substrate 120 that includes the diffraction grating 115. The first electrode 60 may generally be formed by a photo-lithography process or by a mask sputtering process.

A partition wall 70 is then formed. A photo-sensitive resin material, for example, an acrylic positive-tone resist, is used and patterned by an ordinary photolithography process. Thus, the partition wall 70 is formed.

Thereafter, an organic active layer 64 including the organic light-emitting layer and hole buffer layer is formed in each pixel. Specifically, a 2.0 wt % solution of a light-emitting high polymer material, of which the hole buffer layer and organic light-emitting layer are formed, is jetted toward the pixels that are partitioned by the partition wall 70 and is coated on the first electrode 60. The coating of the solution is carried out using a piezo-type ink jet nozzle, under the condition that the feed amount of light-emitting polymer material is set at 0.05 ml/min.

Solvent contained in the solution is removed by executing a drying process for 15 seconds at a high temperature of 100° C. The organic active layer 64 of each pixel, which is thus formed, has a uniform thickness after the removal of solvent. In this example, the organic active layer 64 has a thickness of about 1500 Å. Electrical insulation is ensured between the first electrode 60 and a second electrode 66 that is to be subsequently formed, and occurrence of short-circuit can be prevented.

A second electrode 66 is formed on the organic active layer 64. Specifically, barium (Ba) is deposited as a metal film, which functions as a cathode, to a film thickness of 600 Å with a degree of vacuum of $10^{-7}$ Pa. Subsequently, aluminum (Al) is deposited as a metal film, which functions as a cover metal, to a film thickness of 1500 Å to 3000 Å. Thus, the organic EL element 40 is formed.

In order to seal the display area 102 of the array substrate 100, an ultraviolet-curing sealing material 400 is coated along the outer periphery of the sealing member 200. In an inert gas atmosphere such as nitrogen gas or argon gas, the array substrate 100 and sealing member 200 are bonded to each other. Thus, the organic EL elements 40 are sealed in the closed space of the inert gas atmosphere. Then, ultraviolet is radiated to cure the sealing material 400.

The luminance of the active-matrix color organic EL display device of back-face-emission type, which was thus fabricated, was compared with the luminance of a prior-art device having no diffraction grating, with the same driving current being supplied. It was found that the display device with the diffraction grating achieved an about four times higher luminance, and realized a good display performance. No large current needs to be supplied in order to enhance the luminance, and degradation of the device can be suppressed. Therefore, an adequate performance for the product can be maintained for a long time.

The ink jet method is adopted in order to form the mask materials 203 (R, G, B), with which the diffraction grating 115 is to be formed, and the organic active layer 64. Thus, the efficiency of use of material is about 80% and is high. It was found that all the material, except the portion left in the material supply system, was effectively used for the film formation. Thereby, the manufacturing yield can be improved.

The present invention is not limited to the above-described embodiment. In practice, the structural elements can be modified without departing from the spirit of the invention. Various inventions can be made by properly combining the structural elements disclosed in the embodiment. For example, some structural elements may be omitted from all the structural elements disclosed in the embodiment. Furthermore, structural elements in different embodiments may properly be combined.

For example, the structure of the organic EL element, which is applicable to the present invention, is not restricted if the function of the invention can be implemented. For example, the invention may be a device wherein an organic active layer is formed by an evaporation patterning method using a low-molecular-weight material, or may be a device wherein an organic active layer is formed by an ink jet method using a high-polymer material.

In the coating of mask materials, the ink jet method was adopted as the selective coating method in the embodiment. Alternatively, other selective coating methods may be used.

The diffraction grating 115 has been formed of the second insulating layer 201 having projections and recesses with predetermined pitches, and the planarization layer that has a refractive index different from the refractive index of the second insulating layer 201 and is laid over the projections and recesses in the second insulating layer 201. The structure of the diffraction grating 115 is not limited to this. For example, the diffraction grating 115 may be formed of phase-separating polymers in which parts with different refractive indices are separated with predetermined pitches on the substrate 120a. In this case, the diffraction grating can easily be formed by phase-separating the phase-separating polymers, which have been applied to the above-described embodiment.

Besides, the diffraction grating may be replaced with a light dispersion layer. In this case, too, a good display performance and a high manufacturing yield can be obtained. For example, using a selective coating method such as an ink jet method, a mixture liquid of fine particles for adjusting the light extraction function and a resin for fixing the fine particles is coated in place of the phase-separating polymer. Thereby, a light dispersion layer with optically adjusted conditions for each color can easily be disposed. For example, resins, in which fine particles with different grain sizes, grain shapes and grain materials, can be coated for the respective colors. Compared to the case of using a full-surface coating method such as a spin-coat method, non-uniformity due to a difference in centrifugal force at the time of spinning can be suppressed. Moreover, it is not necessary to execute a patterning step in which a problem relating to processing precision arises due to the presence of fine particles, and the manufacturing yield can further be increased Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a display device including a first color pixel and a second color pixel that are disposed on a substrate and emit light of different wavelengths, a first diffraction grating that is provided in association with the first color pixel, and a second diffraction grating that is provided in association with the second color pixel and has a grating pitch that is different from a grating pitch of the first diffraction grating, the method comprising:
   a step of forming an insulating layer on the substrate;
   a step of forming a resist for separating areas corresponding to the respective color pixels on the insulating layer:
   a step of coating a first mask material on an area associated with the first color pixel on the insulating layer;

a step of coating a second mask material on an area associated with the second color pixel on the insulating layer; and a step of patterning the insulating layer using the first mask material and the second mask material, and forming the first diffraction grating and the second diffraction grating, respectively, wherein the first mask material and the second mask material are coated by an ink jet method.

2. The method of manufacturing a display device, according to claim 1, wherein the first mask material and the second mask material are phase-separating polymers.

3. The method of manufacturing a display device, according to claim 1, further comprising, prior to the steps of coating the first mask material and the second mask material, a step of forming a separation wall that separates the area associated with the first color pixel and the area associated with the second color pixel.

4. The method of manufacturing a display device, according to claim 1, wherein the grating pitch of the first diffraction grating, which is provided in association with the first color pixel, is less than the grating pitch of the second diffraction grating, which is provided in association with the second color pixel that emits light having a greater wavelength than light that is emitted from the first color pixel.

5. The method of manufacturing a display device, according to claim 1, wherein the step of forming the first diffraction grating and the second diffraction grating includes a step of planarizing a surface of the patterned insulating layer with a material with light transmissivity.

6. The method of manufacturing a display device, according to claim 5, wherein the material, with which the insulating layer are planarized, is an organic insulation film having a glass transition point of 90° C. to 120° C.

7. The method of manufacturing a display device, according to claim 1, wherein each color pixel includes a first electrode with light transmissivity, which is formed in an insular shape on the diffraction grating, a second electrode that is disposed to be opposed to the first electrode, and an optical active layer that is interposed between the first electrode and the second electrode.

8. A method of manufacturing a display device including a first color pixel and a second color pixel that are disposed on a substrate and emit light of different wavelengths, a first diffraction grating that is provided in association with the first color pixel, and a second diffraction grating that is provided in association with the second color pixel and has a grating pitch that is different from a grating pitch of the first diffraction grating, the method comprising:

a step of forming an insulating layer on the substrate;

a step of forming a resist for separating areas corresponding to the respective color pixels on the insulating layer;

a step of selectively coating a first polymer on an area associated with the first color pixel on the insulating layer by an ink jet method;

a step of selectively coating a second polymer on an area associated with the second color pixel on the insulating layer by an ink jet method; and a step of phase-separating the first polymer and the second polymer, thereby forming the first diffraction grating and the second diffraction grating, respectively.

* * * * *